United States Patent
Berke et al.

(10) Patent No.: US 7,500,115 B2
(45) Date of Patent: Mar. 3, 2009

(54) INFORMATION HANDLING SYSTEM INCLUDING A MEMORY DEVICE CAPABLE OF BEING POWERED BY A BATTERY

(75) Inventors: Stuart Berke, Austin, TX (US); Shane Chiasson, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 364 days.

(21) Appl. No.: 11/145,249

(22) Filed: Jun. 3, 2005

(65) Prior Publication Data

US 2006/0277422 A1 Dec. 7, 2006

(51) Int. Cl.
G06F 1/00 (2006.01)
G06F 11/30 (2006.01)
G06F 13/00 (2006.01)
(52) U.S. Cl. .................. 713/300; 713/340; 711/106
(58) Field of Classification Search ........... 713/300, 713/340; 711/106
See application file for complete search history.

(56) References Cited

U.S. PATENT DOCUMENTS

| 4,977,537 | A | * | 12/1990 | Dias et al. ............. 711/106 |
| 5,204,963 | A | * | 4/1993 | Noya et al. ............. 365/229 |
| 5,241,680 | A | * | 8/1993 | Cole et al. ............. 713/322 |
| 5,373,478 | A | * | 12/1994 | Komatsu et al. ......... 365/229 |
| 5,604,708 | A | * | 2/1997 | Helms et al. ........... 365/229 |
| 5,650,974 | A | * | 7/1997 | Yoshimura ............. 365/229 |
| 5,652,069 | A |   | 7/1997 | Sakai et al. |
| 5,677,890 | A | * | 10/1997 | Liong et al. ........... 365/229 |
| 5,784,291 | A | * | 7/1998 | Chen et al. ............ 716/10 |
| 5,784,548 | A | * | 7/1998 | Liong et al. ........... 714/6 |
| 5,798,961 | A | * | 8/1998 | Heyden et al. .......... 365/52 |
| 6,088,762 | A | * | 7/2000 | Creta ................. 711/106 |
| 6,239,578 | B1 | * | 5/2001 | Schnell et al. .......... 320/119 |
| 6,374,310 | B2 | * | 4/2002 | Isomura ............... 710/15 |
| 6,385,114 | B1 | * | 5/2002 | Abe et al. ............. 365/226 |
| 6,427,072 | B1 |   | 7/2002 | Reichelt |
| 6,567,899 | B2 | * | 5/2003 | Ghosh et al. ........... 711/156 |
| 6,668,179 | B2 |   | 12/2003 | Jiang |
| 7,089,435 | B2 | * | 8/2006 | Kawakubo ............. 713/300 |
| 7,114,658 | B2 | * | 10/2006 | Lima et al. ............ 235/492 |
| 7,143,298 | B2 | * | 11/2006 | Wells et al. ........... 713/300 |
| 2002/0080541 | A1 | * | 6/2002 | Bunker et al. .......... 361/72 |

OTHER PUBLICATIONS www.troygroup.com/securityprinting/products.

* cited by examiner

Primary Examiner—Rehana Perveen
Assistant Examiner—Ji H Bae
(74) Attorney, Agent, or Firm—Haynes and Boone, LLP

(57) ABSTRACT

An information handling system (IHS) includes a processor, a memory module coupled to the processor, a memory device, and a power source, coupled to the memory device, for supplying power to the memory device. Also, the IHS includes a first battery, coupled to the memory device, for supplying power to the memory device, a second battery, located on the memory module and coupled to the memory device, for supplying power to the memory device, and a switching circuit coupled to the memory device, the power source, the first battery, and the second battery. The switching circuit is for, in response to determining that the power source is unavailable to supply power to the memory device, supplying power from the first battery. The switching circuit is also for, in response to determining that the power source and the first battery are unavailable to supply power to the memory device, supplying power from the second battery.

18 Claims, 4 Drawing Sheets

INFORMATION HANDLING SYSTEM INCLUDING A MEMORY DEVICE CAPABLE OF BEING POWERED BY A BATTERY

BACKGROUND

The description herein relates generally to information handling systems (IHSs) and more particularly to an IHS that includes a memory device capable of being powered by a battery.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

A memory device (e.g., a memory device included in a memory module such as a double in-line memory module (DIMM), such as a cache memory device may be couple to a battery so that the memory device is capable of retaining information stored therein while being powered by the battery (and not by primary power source of an IHS that includes the memory device). For example, an IHS that includes the memory device may fail or otherwise exhibit reduced operability so that the memory device does not receive power from the IHS' power source. In such situation, a technician may remove the memory device from the failed IHS and install the memory device in a replacement IHS. Accordingly, while it remains in the failed IHS and/or while a technician is transporting it from the failed IHS to the replacement IHS, the memory device receives power from the battery.

A memory device including a battery is subject to various problems including problems associated with physical size of the battery. For example, physical size of a battery included in a memory device is directly related to the memory device's capacity. Accordingly, a memory device's capacity may be limited by size of a battery that the memory device and/or an IHS are physically capable of accommodating.

What is needed is an IHS that includes a memory device capable of being powered by a battery without the disadvantages discussed above.

SUMMARY

Accordingly, a method and an information handling system (IHS) is provided. The method includes, in response to determining that a power source is unavailable to supply power to a memory device included on a memory module, supplying power from a first battery located on a controller board. The method also includes in response to determining that the power source and the first battery are unavailable to supply power to the memory device, supplying power from a second battery located on the memory module.

DETAILED DESCRIPTION

For purposes of this disclosure, an information handling system (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
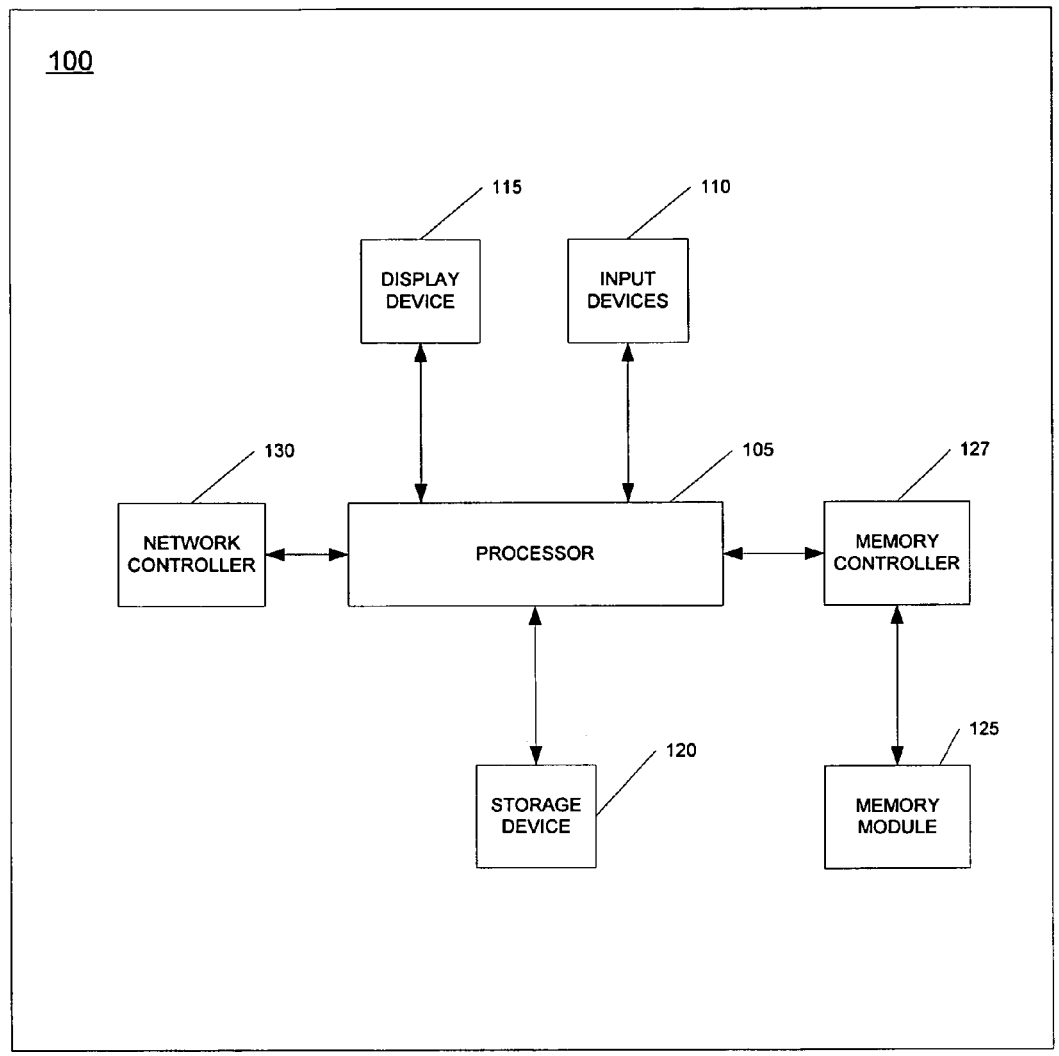
FIG. 1 is a block diagram of an information handling system (IHS) according to an illustrative embodiment.

FIG. 1 is a block diagram of an IHS, indicated generally at 100, according to the illustrative embodiment. The IHS 100 includes a processor 105 (e.g., an Intel Pentium series processor) for executing and otherwise processing instructions, input devices 110 for receiving information from a human user, a display device 115 (e.g., a cathode ray tube (CRT) device, a projector, a liquid crystal display (LCD) device, or a plasma display device) for displaying information to the user, a storage device 120 (e.g., a non-volatile storage device such as a hard disk drive or other computer readable medium or apparatus) for storing information, a memory module 125 (e.g., random access memory (RAM) module and read only memory (ROM) modules), also for storing information, a memory controller 127 for controlling information communicated between the memory module 125 and the processor 105, and a network controller 130 for communicating between the IHS 100 and a network. Examples of the memory module 125 include single in-line memory modules (SIMMS) and double in-line memory modules (DIMMS) such as fully-buffered DIMMs (FB-DIMMs). In the illustrative embodiment, the memory module 125 includes one or more memory devices (e.g., cache memory devices).

Each of the input devices 110, the display device 115, the storage device 120, the memory device 125, the memory controller 127 and the network controller 130 is coupled to the processor 105, and to one another. More specifically, the memory module 125 is coupled to the processor 105 via the memory controller 127 as shown. Also, in one example, the IHS 100 includes various other electronic circuitry for performing other operations of the IHS 100, such as a print device (e.g., a ink-jet printer or a laser printer) for printing visual images on paper.

The input devices 110 include, for example, a conventional keyboard and a pointing device (e.g., a "mouse", a roller ball, or a light pen). A user operates the keyboard to input alphanumeric text information to the processor 105, and the processor receives such information from the keyboard. A user also operates the pointing device to input cursor-control information to the processor 105, and the processor 105 receives such cursor-control information from the pointing device.

Figure 2:
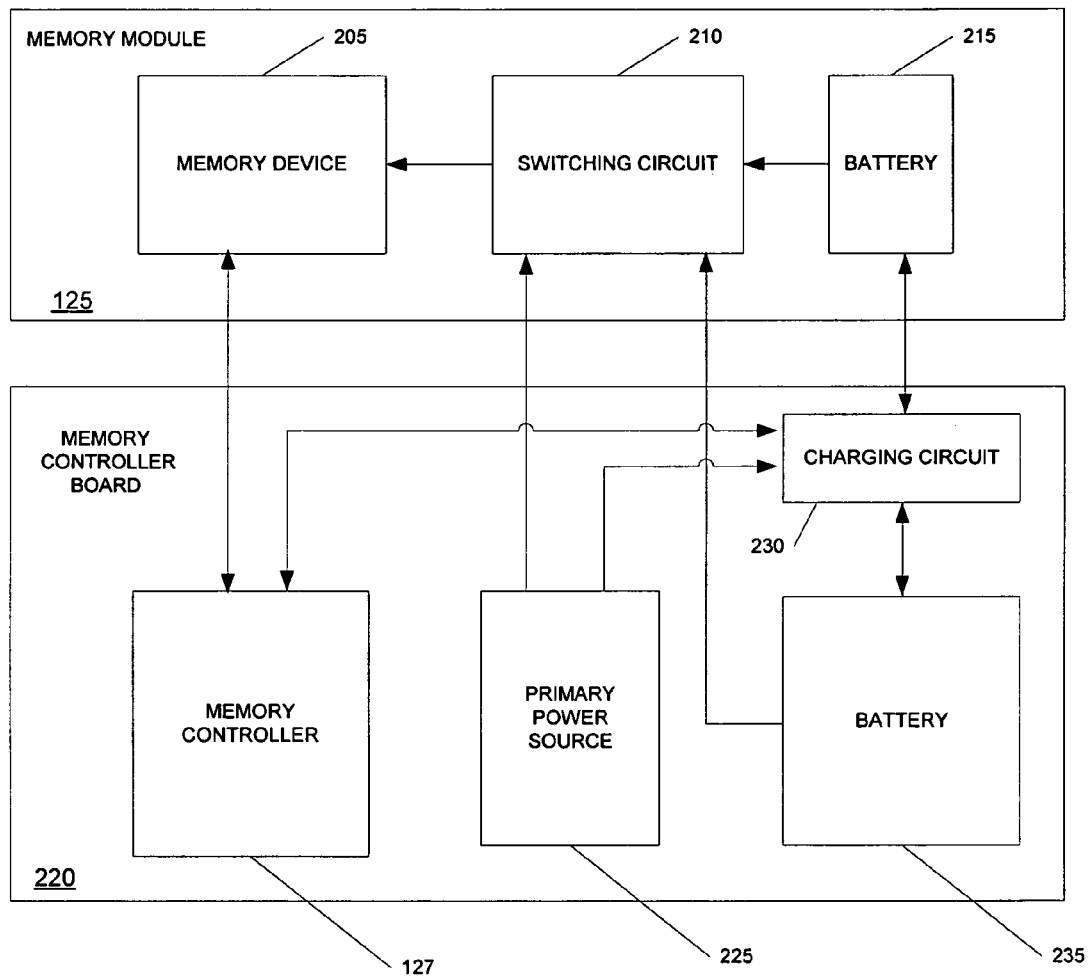
FIG. 2 is a block diagram depicting a memory module of FIG. 1 and a memory controller board.

FIG. 2 is a block diagram of the memory module 125 and a memory controller board, indicated generally at 220, according to an illustrative embodiment. In one example, the memory controller board 220 is a redundant array of independent disks (RAID) controller board. The memory module 125 includes a memory device 205 and a switching circuit 210 coupled to the memory device 205. The memory module 125 also includes a battery 215, coupled to the switching circuit 210. Accordingly, the memory device 205 is coupled to the battery 215 via the switching circuit 210.

The memory controller board 220 includes the memory controller 127 coupled to the memory device 205. The memory controller board 220 also includes a primary power source (e.g., the IHS 100's power rail) 225, which is coupled to the switching circuit 210. Moreover, the memory controller board 220 includes a charging circuit 230 coupled to the battery 215, the memory controller 127, and the power source 225. In other embodiments, the charging circuit 230 is included in other suitable components of the IHS 100. The memory controller board 220 includes a battery 235, which is coupled to the switching circuit 210 and the charging circuit 230. Accordingly, the battery 235 is coupled to the memory device 205 via the switching circuit 210. Similarly, the power source 225 is coupled to the memory device 205 via the switching circuit 210.

As discussed above, the memory module 125 is transportable (e.g., "hot swappable"). For example, the memory module 125 is transportable from the IHS 100 to another IHS (e.g., a replacement IHS). Accordingly, the memory module 125, including its components such as the memory device 205, is removable from the memory controller board 220. Also, the memory module 125 is capable of being coupled to another memory controller board that is substantially similar to the memory controller board 220.

With a conventional technique, while a primary power source for a memory device is not available (e.g., because the IHS including the power source is being serviced or otherwise exhibits reduced operability), the memory device retains information stored therein by receiving power from a battery located on the memory module on which the memory device is located. According to a common industry practice, such battery located on the memory module includes sufficient power capacity to allow the memory device to retain information stored therein for about 72 hours.

However, as discussed above, a relative increase in memory device capacity also increases an associated battery's capacity requirement. Such direct relationship between memory device capacity and battery capacity holds true even while such memory device operates in a low power state (e.g., a "self refresh mode"). Also, a battery which initially includes redundant capacity may be desirable because a battery's capacity degrades over time and use (e.g., due to thermal degradation). For example, a battery's capacity may be reduced by about 50 percent after about three years of use.

Moreover, a relative increase in battery capacity also increases such battery's size (i.e., volume). However, various components (e.g., a RAID controller board) associated with a transportable memory device are subject to one or more industry standards which may limit a conventional battery's form factor. In one example, a form factor of a DIMM and/or industry standard card specifications effectively limit a battery's maximum dimensions (e.g., a battery's height, width, and length).

Accordingly, such limitations on size of a battery for supplying power in a transportable memory module, also limits memory capacity of the memory module. For example, if a memory module includes a memory device with capacity of 256 megabytes (MB), and the size of a battery included on the memory module is substantially the maximum size allowable (e.g., by various industry standards), the memory module cannot include a memory device with capacity greater than 256 MB. As discussed above, this is because increasing a memory device's capacity increases the size of a battery providing back up power to the memory device.

Accordingly, for reducing the severity of the problem discussed above, the IHS 100 includes at least two batteries. More particularly, the memory module 125 includes the battery 215 and the memory controller board 220 includes the battery 235.

While the IHS 100's operating "normally" or the power source 225 is otherwise available, the memory device 205 receives power from the power source 225. However, if the power source 225 is unavailable, but the battery 235 is available (e.g., because the memory module 125 has not been decoupled from the memory controller board 220 for transportation to a replacement IHS) the memory device 205 receives power from the battery 235. If both the power source 225, and the battery 235 are not available, the memory device 205 receives power from the battery 235. Accordingly, the switching circuit 210 selectively supplies power from the battery 215, the power source 225, and/or the battery 235.

As discussed above, according to a common industry practice, a conventional memory module includes a battery with capacity sufficient to allow the module's memory device to retain its information for about 72 hours after the memory device ceases to receive power from a main power source (e.g., because IHS that includes the memory module has become inoperable). However, in a typical scenario, an amount of time that a service technician removes a memory module from its IHS (and its memory controller board) is less than the total amount of time (e.g., 72 hours) during which the module's memory device stops receiving power from its primary power source and is transported into a replacement IHS. In one example, such amount of time during which a memory module is removed from an IHS (e.g., either the inoperable IHS or an replacement IHS) is less than 4 hours.

Accordingly, referring again to FIG. 2, the battery 235's capacity is greater than the battery 215's capacity. The battery 235's capacity is suitable for supplying power to the memory device 205 in response to the power source 225 becoming unavailable. For example, the battery 235's capacity is suitable for supplying power to the memory device 205 while the memory module 125 remains coupled to the memory controller board 220 (e.g., because service has been deferred over a weekend).

By comparison, the battery 215's capacity is suitable for supplying power to the memory device 205 in response to the battery 235 becoming unavailable to supply power to the memory device 205. As discussed above, in one example, the battery 215 supplies such power to the memory device 205 while the memory module 125 is decoupled from the board 220 (and thus the IHS 100) and before the module 125 is coupled to another memory controller board. For example, the battery 215 is capable of supplying power to the memory device 205 for about 4 hours.

Figure 3:
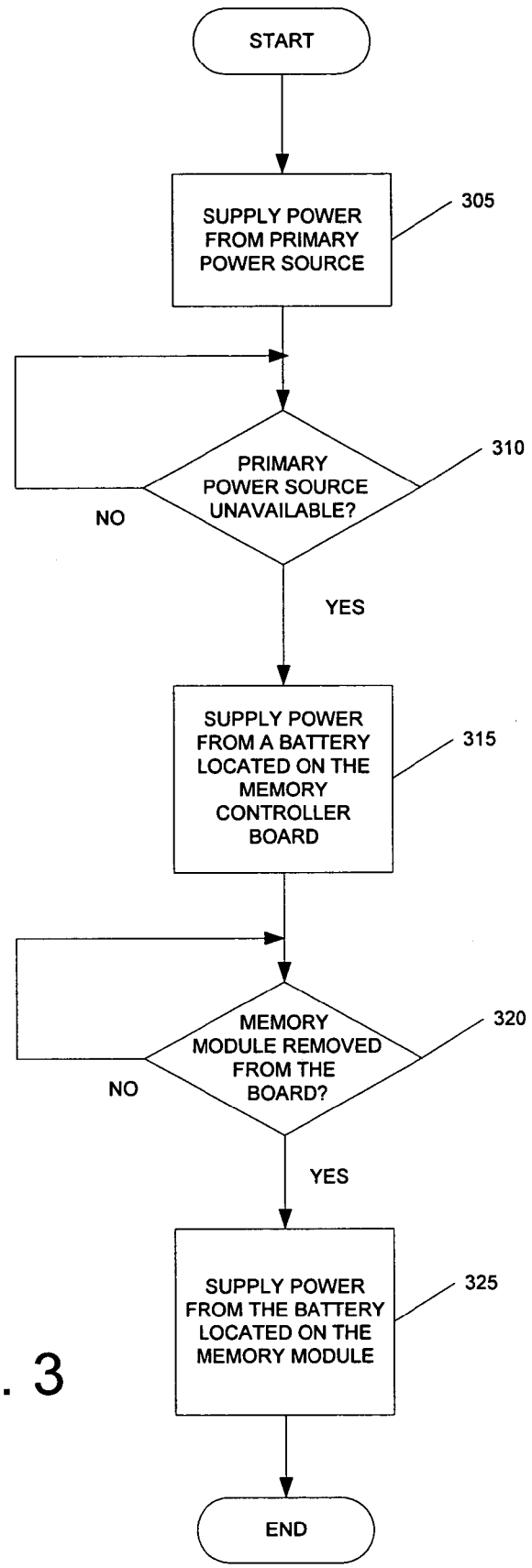
FIG. 3 is a flow chart of operations performed by a switching circuit of FIG. 2.

FIG. 3 is a flow chart of operations performed by the switching circuit 210 for supplying power to the memory device 205. For clarity, the following discussions reference the steps sequentially. However, the operations discussed in connection with FIG. 3 are not limited by such sequence.

The operations begin at a step 305, where the switching circuit 210 supplies power to the memory device 205 from the power source 225. At this step, the IHS 100 is operating "normally". After the step 305, the operations continue to a step 310.

At the step 310, while supplying power from the power source 225, the switching circuit 210 self-loops until the power source 225 has become unavailable. In response to the power source 225 becoming unavailable, the operations continue to a step 315.

At the step 315, the switching circuit 210 supplies backup power from the battery 235 so that the memory device 205 retains information stored therein. After the step 205, the operations continue to a step 320.

At the step 320, while supplying power from the battery 235, the switching circuit 210 self-loops until the battery 235 has become unavailable, for example because the memory module 125 was removed from the memory controller board 220 to be transported to another IHS. In response to the switching circuit 210 determining that the battery 235 has become unavailable, the operations continue to a step 325.

At the step 325, the switching circuit 210 supplies backup power from the battery 215 so that the memory device 205 retains information stored therein while the memory module 125 is decoupled from a memory controller board. After the step 325, the operations end.

Referring again to FIG. 2, because the battery 215's capacity is less than the battery 235's capacity, the battery 215 is also physically smaller than the battery 235. In an example discussed above, the battery 215 is capable of supplying power to the memory device 205 for about 4 hours, and the battery 235 is capable of supplying power to the memory device 205 for about 72 hours. Accordingly, the capacity ratio of the battery 235 to the battery 215 is about 18 to 1. In comparison to a conventional memory module in which a single battery located in the memory module supplies backup power to a memory device, the memory module 125 is capable of having a memory device with a greater capacity.

Also by including a reduced capacity battery (i.e., the battery 215) on the memory module 125, the memory module 125's form factor is also condensable. Accordingly, the memory controller board 220 is capable of supporting reduced form factor memory modules (e.g., "MiniDIMMs" and "MicroDIMMs").

Moreover, providing the at least two batteries 215 and the 235 increases the IHS 100's performance. As discussed above, in one example, the memory controller board 220 is a RAID controller board and the memory device 205 is a cache memory device. With a conventional RAID controller board and a memory module including a single back up battery, the RAID controller board deactivates write-back cache mode and activates write-through cache mode while it discharges and recharges (e.g., "conditions") the single battery. This is because a sudden unavailability of a primary power source (e.g., caused by a sudden IHS shutdown) may cause information loss if the RAID controller board is set to write-back cache mode. While the RAID controller board operates in write-through cache mode, the IHS 100's performance is reduced.

By comparison, with the controller board 220 and the memory module 125, the battery 215 is capable of supplying power to the memory device 205 while the battery 235 is being conditioned, and vice versa. Accordingly, a period of time during which the controller board 220 is set to write-through cache is reduced.

Figure 4:
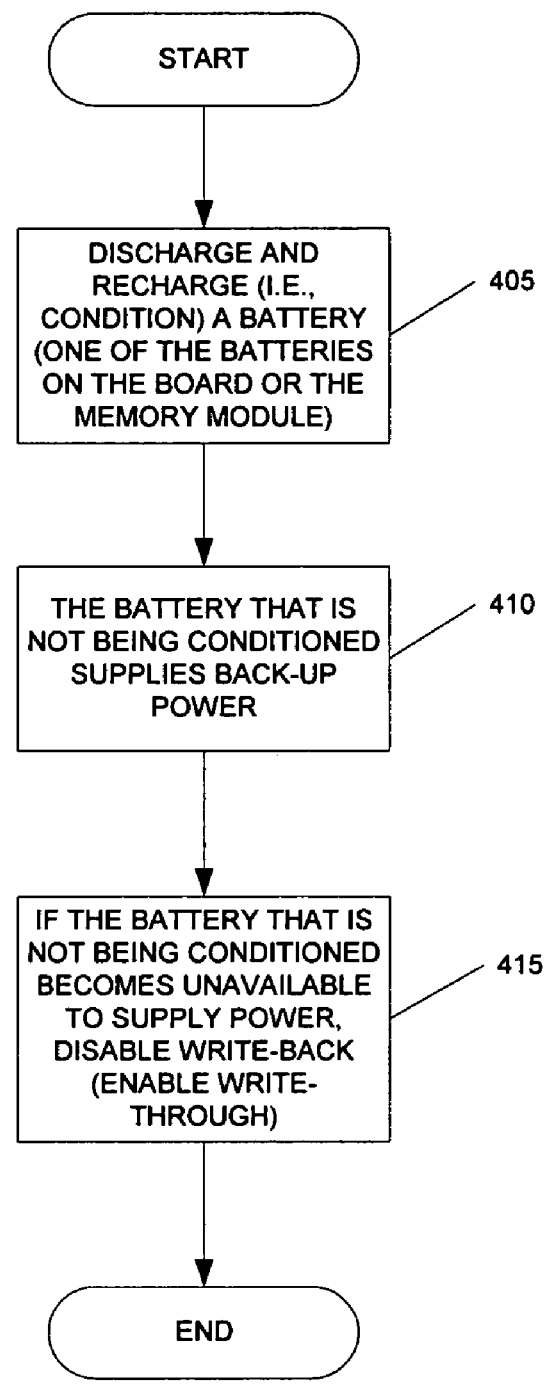
FIG. 4 is a flow chart of operations performed by the IHS of FIG. 1.

FIG. 4 is a flow chart of operations of the IHS 100 for conditioning one or more of the batteries 215 and 235. For clarity, the following discussions reference the steps sequentially. However, the operations discussed in connection with FIG. 4 are not limited by such sequence.

The operations begin at a step 405, where the IHS 100 conditions one of the batteries 215 and 235 by discharging and recharging such battery in a controlled manner. After the step 405, the operations continue to a step 410.

At the step 410, while the one battery is being conditioned, the other battery that is not being conditioned supplies backup power to the memory device 205. Accordingly, the controller board 220 is capable of operating in write-back cache mode even while one of the batteries 215 and 235 is being conditioned. After the step 410, the operations continue to a step 415.

At the step 415, the IHS 100 determines whether the battery that is not being conditioned becomes unavailable to supply power. In response to determining as such, the controller board 220 is set to write-through mode.

In one example, the memory controller 127 conditions the batteries 215 and 235. Accordingly, the charging circuit 230 is capable of charging and discharging the batteries 215 and the 235 in response to an instruction from the memory controller 127. The memory controller 127 (e.g., in response to executing the controller board 220's firmware) also monitors each of the batteries 215 and 235, such that the batteries 215 and 235 are charged properly and are in operable condition.

Although illustrative embodiments have been shown and described, a wide range of modification, change and substitution is contemplated in the foregoing disclosure. Also, in some instances, some features of the embodiments may be employed without a corresponding use of other features. Accordingly, it is appropriate that the appended claims be constructed broadly and in manner consistent with the scope of the embodiments disclosed herein.

What is claimed is:

1. An information handling system (IHS) comprising:
   a processor;
   a memory module coupled to the processor via a memory controller on a memory controller board, the memory module, including a memory device;
   a power source on the memory controller board, coupled to the memory device, for supplying power to the memory device;
   a first battery on the memory controller board, coupled to the memory device, for supplying power to the memory device;
   a second battery, located on the memory module and coupled to the memory device, for supplying power to the memory device;
   a switching circuit coupled to the memory device, the power source, the first battery, and the second battery, for:
      in response to determining that the power source is unavailable to supply power to the memory device, supplying power from the first battery; and
      in response to uncoupling the memory device from the memory controller, supplying power from the second battery; and
   a charging circuit residing on the memory controller board and capable of charging and discharging the first and second batteries in response to an instruction from the memory controller.

2. The IHS of claim 1, wherein the first battery's capacity is greater than the second battery's capacity.

3. The IHS of claim 2, wherein the first battery's capacity is suitable for supplying power to the memory device while the IHS exhibits reduced operability, and the memory module is coupled to the IHS.

4. The IHS of claim 3, wherein the first battery is capable of supplying power to the memory device for about 72 hours.

5. The IHS of claim 2, wherein the second battery's capacity is suitable for supplying power to the memory device while the IHS exhibits reduced operability, and the memory module is removed from the IHS.

6. The IHS of claim 5, wherein the second battery is capable of supplying power to the memory device for about 4 hours.

7. The IHS of claim 1, wherein while the first battery is conditioned, the second battery supplies backup power to the memory device.

8. The IHS of claim 1, wherein while the second battery is conditioned, the first battery supplies backup power to the memory device.

9. The IHS of claim 1, wherein the switching circuit resides on the memory module.

10. A method comprising:
   in response to determining that a power source is unavailable to supply power to a memory device included on a memory module, supplying power from a first battery located on a controller board;
   in response to uncoupling the memory device from the controller board, supplying power to the memory device from a second battery located on the memory module; and
   charging and discharging the first and second batteries by a charging circuit residing on the memory controller board in response to an instruction from a memory controller.

11. The method of claim 10, wherein the first battery's capacity is greater than the second battery's capacity.

12. The method of claim 11, wherein the first battery's capacity is suitable for supplying power to the memory device while an IHS, that includes the memory device, exhibits reduced operability, and the memory module is coupled to the IHS.

13. The method of claim 12, wherein the first battery is capable of supplying power to the memory device for about 72 hours.

14. The method of claim 11, wherein the second battery's capacity is suitable for supplying power to the memory device while an IHS, that includes the memory device, exhibits reduced operability, and the memory module is removed from the IHS.

15. The method of claim 14, wherein the second battery is capable of supplying power to the memory device for about 4 hours.

16. The method of claim 10, wherein while the first battery is conditioned, the second battery supplies backup power to the memory device.

17. The method of claim 10, wherein while the second battery is conditioned, the first battery supplies backup power to the memory device.

18. The method of claim 1, wherein a switching circuit selectively supplies power to the memory device from the power source, the first battery, or the second battery.

* * * * *